(12) United States Patent
Waayers

(10) Patent No.: US 7,870,449 B2
(45) Date of Patent: Jan. 11, 2011

(54) IC TESTING METHODS AND APPARATUS

(75) Inventor: Tom Waayers, Sint Michielsgestel (NL)

(73) Assignee: NXP B.V., Eindhoven (NL)

( * ) Notice: Subject to any disclaimer, the term of this patent is extended or adjusted under 35 U.S.C. 154(b) by 316 days.

(21) Appl. No.: 12/090,946

(22) PCT Filed: Oct. 12, 2006

(86) PCT No.: PCT/IB2006/053754

§ 371 (c)(1),
(2), (4) Date: Apr. 21, 2008

(87) PCT Pub. No.: WO2007/049171

PCT Pub. Date: May 3, 2007

(65) Prior Publication Data
US 2008/0290878 A1 Nov. 27, 2008

(30) Foreign Application Priority Data
Oct. 24, 2005 (EP) .................................. 05109892

(51) Int. Cl.
*G01R 31/28* (2006.01)
*G01R 31/02* (2006.01)
(52) U.S. Cl. .................. 714/727; 714/724; 714/726; 714/729; 714/733; 324/537; 324/763; 324/765
(58) Field of Classification Search ................ 714/724, 714/726, 727, 729, 733, 734; 324/537, 763, 324/765
See application file for complete search history.

(56) References Cited

U.S. PATENT DOCUMENTS 6,611,934 B2 * 8/2003 Whetsel, Jr. ................. 714/727

(Continued)

FOREIGN PATENT DOCUMENTS

WO 2004070395 A2 8/2004

(Continued)

OTHER PUBLICATIONS

Fang et al., "Power-Constrained Embedded Memory BIST Architecture", 2003, IEEE International Symposium on Defect and Fault Tolerance in VLSI Systems, pp. 451-458.*

(Continued)

*Primary Examiner*—John J Tabone, Jr.

(57) ABSTRACT

A testing circuit has a shift register circuit (76) for storing instruction data for the testing of an integrated circuit core. Each stage of the shift register circuit comprises a first shift register storage element (32) for storing a signal received from a serial input (wsi) and providing it to a serial output (wso) in a scan chain mode of operation, and a second parallel register storage element (38) for storing a signal from the first shift register storage element and providing it to a parallel output in an update mode of operation. The testing circuit further comprises a multiplexer (70) for routing either a serial test input to the serial input (wsi) of the shift register circuit or an additional input (wpi[n]) into the serial input of the shift register circuit (76). In a preferred example, the testing circuit further comprises a control circuit (78) which responds to a specific value of data stored in at least one stage of the shift register to generate an update signal for setting the other shift register stages into the update mode of operation.

22 Claims, 10 Drawing Sheets

U.S. PATENT DOCUMENTS

| | | | |
|---|---|---|---|
| 6,643,810 B2 * | 11/2003 | Whetsel | 714/724 |
| 6,813,738 B2 * | 11/2004 | Whetsel, Jr. | 714/727 |
| 7,047,467 B1 * | 5/2006 | Khu et al. | 714/727 |
| 7,401,277 B2 * | 7/2008 | Yamada et al. | 714/726 |
| 7,409,612 B2 * | 8/2008 | Van De Logt et al. | 714/727 |
| 7,506,231 B2 * | 3/2009 | Chang et al. | 714/726 |
| 7,620,866 B2 * | 11/2009 | Marinissen et al. | 714/727 |
| 2003/0101397 A1 * | 5/2003 | Whetsel, Jr. | 714/726 |
| 2004/0199839 A1 * | 10/2004 | Whetsel, Jr. | 714/726 |
| 2005/0204236 A1 | 9/2005 | Whetsel | |
| 2006/0156104 A1 * | 7/2006 | Chang et al. | 714/724 |
| 2008/0034334 A1 * | 2/2008 | Laouamri et al. | 716/4 |

FOREIGN PATENT DOCUMENTS

| | | | |
|---|---|---|---|
| WO | 2007049172 A2 | 5/2007 | |
| WO | 2007049173 A2 | 5/2007 | |

OTHER PUBLICATIONS

DaSilva et al., "Overview of the IEEE PI500 Standard", 2003, ITC International Test Conference, pp. 988-997.*

Dervisoglu, "A Unified DFT Architecture for use with IEEE 1149.1 and VSINIEEE P1500 Compliant Test Access Controllers", Jun. 18-22, 2001, DAC 2001, pp. 53-58.*

Li, et al., "A Hierarchical Test Scheme for System-on-Chip Designs", Mar. 4-8, 2002, Design, Automation and Test in Europe Conference and Exhibition (Date'02), pp. 486-490.*

Vermaak, H., J; et al "Using the Oscillation Test Method to Test for Delay Faults in Embedded Cores" Africon, 2004. 7th Africon Conference in Africa Gaborone, Botswana. vol. 2, Sep. 15, 2004, pp. 1105-1110.

Waayers, Tom—Institute of Electrical and Electronics Engineers: "An Improved Test Control Architecture and Test Control Expansion for Core-Based System Chips" Proceedings International Test Conference 2003. (ITC). vol. 1, Sep. 30, 2003, pp. 1145-1154.

Benabdenbi, M; et al "Testing Taped Cores and Wrapped Cores With the Same Test Access Mechanism" Design, Automation and Test in Europe, 2001. Conference and Exhibition 2001. Proceedings. Mar. 13, 2001, pp. 150-155.

Marinissen, E., J; et al "Infrastructure for Modular SOC Testing" Custom Integrated Circuits Conference, 2004. Proceedings of the IEEE 2004. Oct. 3, 2004, pp. 671-678.

Vermeulen, B; et al "IEEE 1149.1-Compliant Access Architecture for Multiple Core Debug on Digital System Chips" Proceedings International Test Conference 2002. ITC 2002. Oct. 7, 2002, pp. 55-63.

* cited by examiner

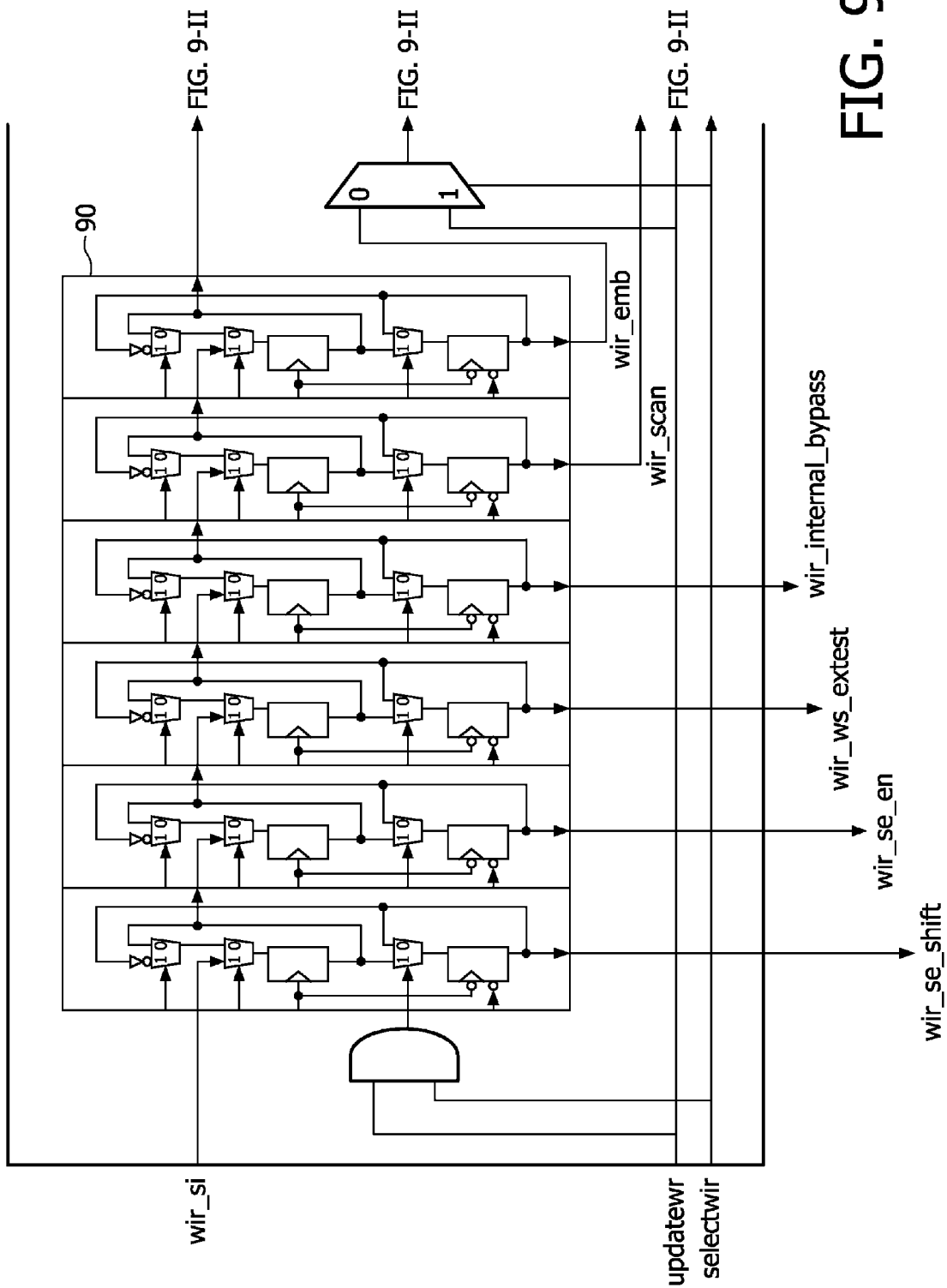
FIG. 9-I

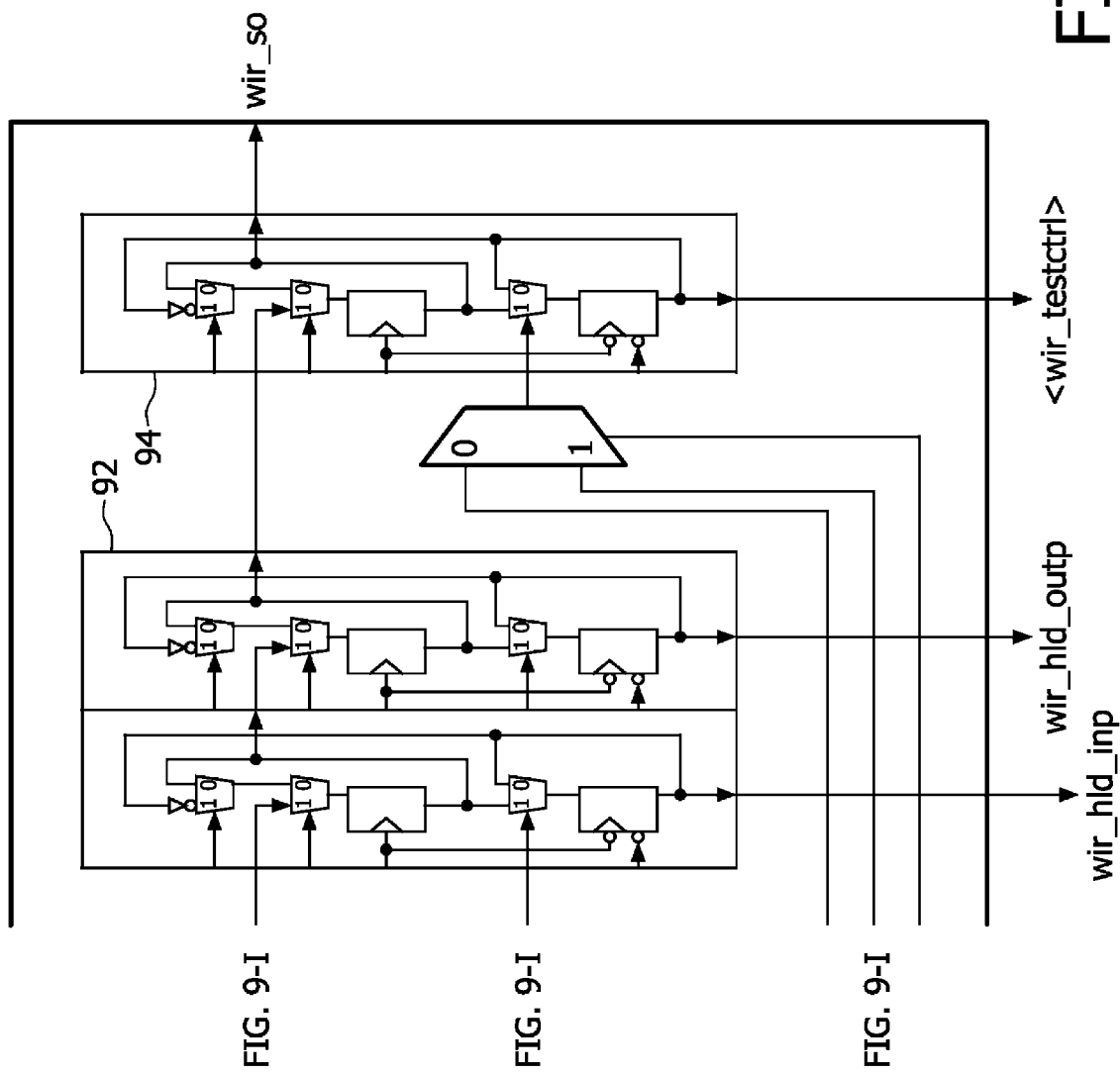
FIG. 9-II

IC TESTING METHODS AND APPARATUS

The present invention generally relates to testing of semiconductor integrated circuits, and in particular relates to a core test method and apparatus.

One common testing technique for the testing of semiconductor integrated circuits (ICs) is a scan testing technique. This essentially involves launching a test pattern (termed "vector") into the pins of a device package and monitoring an output response at a specific time, dependent on the clock speed of the device. A set of test vectors is used to enable the behaviour of the device under test to be determined. These vectors are designed to enable detection of manufacturing defects in the device.

As the number of transistors used in integrated circuits grows, the ability to reuse integrated circuit designs becomes increasingly important. One important issue concerning the reuse of design functions (termed "cores") is the ability to test these cores without re-engineering the testing methodology, so that test reuse can be implemented as well as design reuse. The testing of System on Chip (SoC) circuits with multiple functional cores also becomes an increasing challenge.

Primarily to address these issues, the IEEE P1500 working group was formed, and has developed a core level solution to facilitate test integration and test reuse. The standard has now been adopted as IEEE STD 1500 and provides a standard interface and a set of rules defining the boundary between a core and the logic external to the core. This boundary is termed a "wrapper", and allows the isolated test of a core with minimum signals that must be routed outside the system on chip structure. The wrapper comprises so-called "wrapper cells" for each functional input and functional output of the core.

FIG. 1 shows the basic layout of an IEEE STD 1500 wrapper. The core 1 is surrounded by the wrapper 2, which acts as an interface between all external signals and the core. The wrapper has a wrapper boundary register (WBR) between the core Functional Inputs (FI)/Outputs (FO) and the wrapper functional inputs/outputs. The core terminals are shown as 4, and some of these are functional inputs and some are functional outputs. The standard dictates that the core 1 is defined with unidirectional terminals. The arrows 6 show schematically that the Wrapper Boundary Register acts as the interface between the external functional inputs and outputs and the core functional inputs and outputs.

The Wrapper Boundary Register WBR comprises a chain of cells 8, each associated with an individual functional input or output of the core. These cells are configured into a scan chain to supply the desired test vectors for the control of the core functional inputs or to shift out the results present on the core functional outputs. The cells of the WBR thus essentially implement a scan test technique by providing a selected test vector to the functional inputs and outputs of the core.

The wrapper 2 has a Wrapper Serial Input (WSI) and a Wrapper Serial Output (WSO), and these communicate with an instruction register, termed Wrapper Instruction Register (WIR) and with the Wrapper Boundary Register (WBR).

The Wrapper Boundary Register WBR controls and observes the ports 4 of the functional core. The cells 8 of the WBR are configured in response to the instructions provided to the wrapper instruction register WIR, and the Wrapper Instruction Register essentially controls the testing process.

In particular, the WIR and WBR are configured to operate in response to control signals which indicate the commands "Select", "Capture", "Shift" and "Update".

A shift comprises the advance of the data in the WBR one storage position closer to the test output (and also the advance of data in the WIR or other register). Thus, the shift commands load the WBR cells with the desired test vector.

A capture comprises the storing of the data present on the functional inputs or outputs of the WBR into the WBR cells.

An update comprises storing of the data within the WBR cell shift storage element, using an additional update storage element.

A transfer comprises the movement of data to the WBR cell shift storage element.

Although not shown in FIG. 1, the wrapper receives signals in the form of a Wrapper Capture signal (CaptureWR), a Wrapper Shift signal (ShiftWR) and an Update Wrapper signal (UpdateWR). In addition, the wrapper is controlled by a Wrapper Clock Signal (WRCK), a Wrapper Reset Signal (WRSTN) signal and an Instruction Register Selection signal (SelectWIR).

The Wrapper Instruction Register (WIR) is used to configure the wrapper into a desired mode of operation, determined by the instructions shifted into the WIR. This instruction may be tens or hundreds of bits in length, and can define different test and diagnosis modes of operation. Additional circuitry of the WIR (not shown) is used to interpret the loaded WIR instruction and provide the appropriate control signals to the WBR which controls the interaction with the core.

The wrapper uses the same serial input for the loading of the serial test vectors to be shifted into the WBR cells as for the loading of instruction data, and the SelectWIR signal determines which mode of operation is in use.

The WIR thus decodes loaded instructions and then controls the Wrapper Boundary Register WBR to implement the specified control. The WIR circuitry receives the signals CaptureWR, ShiftWR, UpdateWR and the clock signal WRCK, a reset signal WRSTN signal and the signal SelectWIR, discussed above.

The Wrapper Instruction Register can also control a Wrapper Bypass Register (WBY), which is operable to pass a wrapper serial input (WSI) to the wrapper serial output (WSO) without any interaction with the core. This is in response to a WIR instruction. In addition, an external test can be controlled by the WIR to provide external controllability and observability of the core, and this test involves connecting the Wrapper Boundary Register WBR to the Wrapper Serial Input and Output (WSI and WSO). This enables the loading of customer specified data into the WBR cells.

The Wrapper Instruction Register receives its control input from a Wrapper Serial Control (WSC) input.

The terminals above are from the serial port. The wrapper can also have parallel ports, shown in FIG. 1 as a parallel input port PI and a parallel output port PO.

This invention relates in particular to the Wrapper Instruction Register. The WIR is typically implemented using so-called 'shift/shadow' registers. The basic structure of this type of register consists of a serial shift register and a parallel update register. One advantage for these two sequential layers is the ability to keep test mode conditions (the instruction data) in the parallel update register while loading a new set of test mode conditions (test vector) in the serial shift register.

The wrapper supports an internal test mode (for testing the core) and an external test mode (for testing the interconnects to the core). These modes are determined by the WIR, which provides a set of control signals corresponding to the selected test mode. This set of control signals controls the WBR, and as discussed further below, one control input to the WBR cells is a "hold" input.

The WIR (wrapper instruction register) outputs static control parameters during any particular test mode. However, for the testing of a wrapped core that has embedded wrapped cores, it needs multiple tests to reach full coverage. In particular, the wrappers provide isolation, and have inward and outward facing modes of operation. To provide full coverage, different tests are required which place the multiple wrapped cores into the appropriate modes.

Furthermore, the static nature of the WIR coverage may provide coverage loss.

There is therefore a need for additional flexibility in the control provided by the instruction register.

According to the invention, there is provided a testing circuit for the testing of an integrated circuit core or circuitry external to an integrated circuit core, the testing circuit comprising:

a shift register circuit for storing testing instruction data, the shift register circuit comprising a plurality of stages, each stage comprising:

a serial input and a serial output;

a first shift register storage element for storing a signal received from the serial input and providing it to the serial output in a scan chain mode of operation; and a second parallel register storage element for storing a signal from the first shift register storage element and providing it to a parallel output in an update mode of operation, wherein the testing circuit further comprises a multiplexer for routing either a serial test input to the serial input of the shift register circuit or an additional input into the serial input of the shift register circuit, and wherein the testing circuit further comprises a first input for controlling a first update mode of operation, and a second update mechanism for use when the additional input is routed to the serial input.

This arrangement provides a normal serial interface to a instruction shift register, but also provides an additional update mode in which a user can feed data into the instruction register to provide dynamic control of the testing process.

The second update mechanism is preferably provided by a control circuit which responds to a specific value of data stored in at least one stage of the shift register to generate an update signal for setting the other shift register stages into the update mode of operation.

Data in the instruction register can thus be used to trigger an update mode, so that an instruction register output can be provided dynamically, and based on data fed into the shift register. Thus, an additional update mode is provided which is triggered by data which has been loaded into the shift register.

The additional input can comprise at least one parallel input port of the testing circuit.

The circuit preferably further comprises an instruction register select signal input, and wherein when the instruction register select signal input is active, a serial input to the testing circuit is routed through the multiplexer to the serial input of the shift register circuit, and when the instruction register select signal input is not active, the additional control input is routed through the multiplexer to the serial input of the shift register circuit. This enables normal operation of the testing circuit to be maintained when the instruction register is selected for a normal testing operation.

An update signal input can be provided for setting the shift register stages into the update mode of operation, wherein the update signal input is operable only when the instruction register select signal input is active. This update mechanism is the normal update procedure for testing, and the invention provides an additional update mechanism.

The control circuit may receive the signal loaded into one of the first shift register storage elements. Thus, the data loaded into the shift register is used as an update control signal. One bit may be used for this purpose. The control circuit can then comprise a logic gate structure for providing an update signal to the second parallel register storage elements.

The logic gate structure can provide an update signal when an instruction register select signal is not active and the specific value of the data is present, or when the instruction register select signal is active and an external update signal is active.

The data stored in the second parallel register storage after an update initiated by the control circuit can be used to control wrapper boundary register cells directly or can be used as a wrapper instruction register output.

The control circuit can respond to specific values of data stored in at least two stages of the shift register to generate a first signal for providing testing of an embedded core, and a second signal for providing additional test modes.

The shift register circuit preferably comprises a Wrapper Instruction Register for an embedded core test architecture, for example an IEEE STD 1500 embedded core test architecture.

The invention also provides an IEEE STD 1500 wrapper comprising:

a circuit of the invention in which the shift register circuit comprises a Wrapper Instruction Register;

a Wrapper Boundary Register; and a Wrapper Bypass Register.

An integrated circuit can comprise a circuit core and an IEEE STD 1500 wrapper of the invention.

The invention also provides a method of testing of integrated circuit core or circuitry external to an integrated circuit core, the method comprising using a core wrapper in first and second modes, wherein:

in the first mode, a serial input is coupled to a wrapper instruction register and stored in serial shift register storage elements, and in response to an update signal, the wrapper instruction stored in the serial shift register is loaded into a parallel update register;

in the second mode, user data is provided to the serial input using one port of a wrapper parallel interface, and the wrapper instruction stored in the serial shift register is continuously loaded into the parallel update register in response to a continuous update signal.

This method provides two different update mechanisms for a wrapper instruction register, one standard update mechanism, and an additional continuous update mechanism.

This continuous update mechanism can be triggered by the data provided to the register. Thus, the data loaded into the instruction register can trigger an additional update function.

The first mode is a standard mode of operation, in which serial input data is loaded into the register. In the second mode, data can be provided to the serial input using one port of a wrapper parallel interface, and this can enable additional test modes to be implemented to those of the automatic test pattern generation system. Alternatively, the second mode can be used for testing of embedded cores within a larger core.

An example of the invention will now be described in detail with reference to the accompanying drawings, in which.

Figure 7:
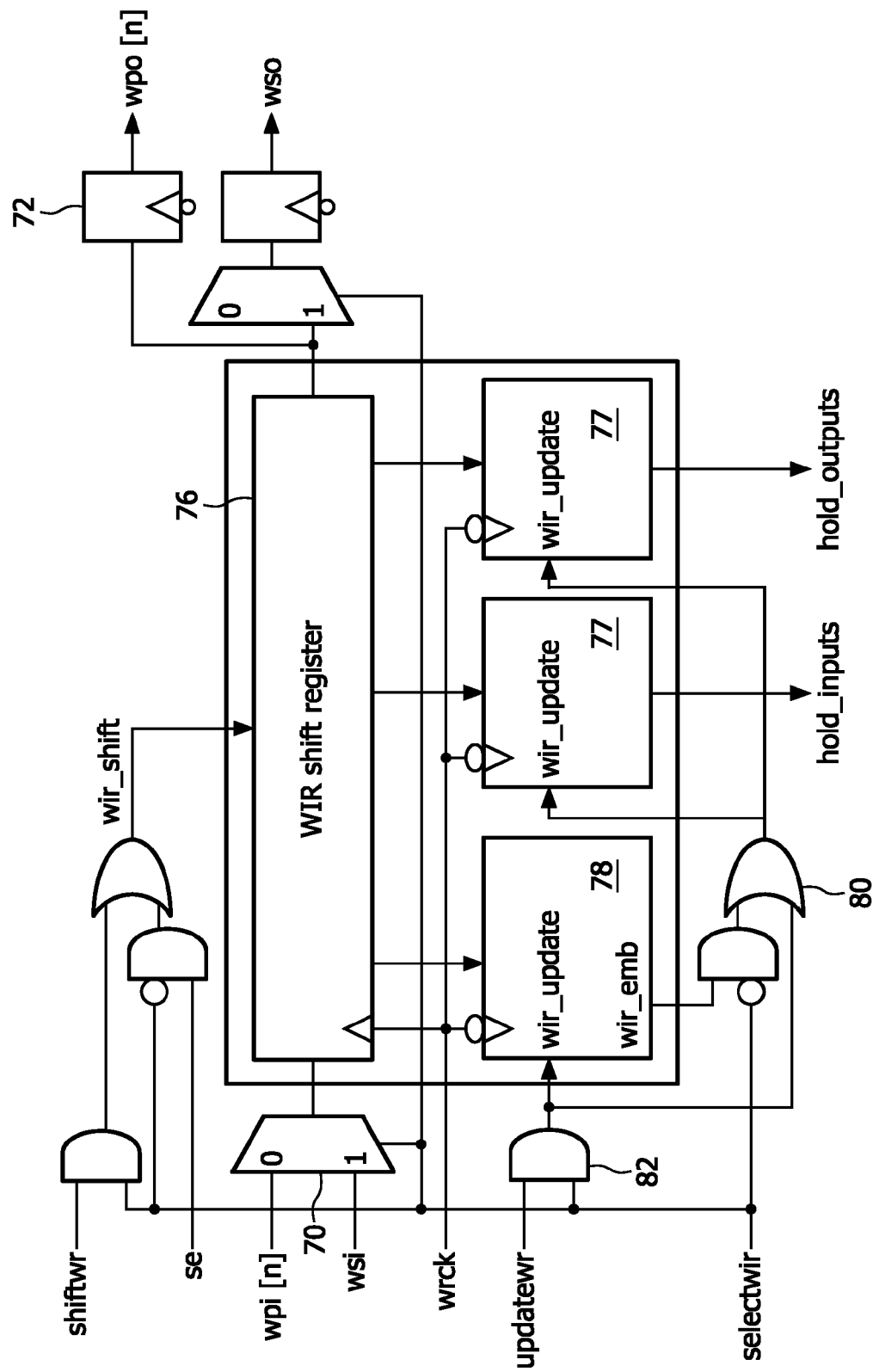
FIG. 7 shows the wrapper instruction register in more detail, with the a first use of the additional test flexibility.
Figure 8:
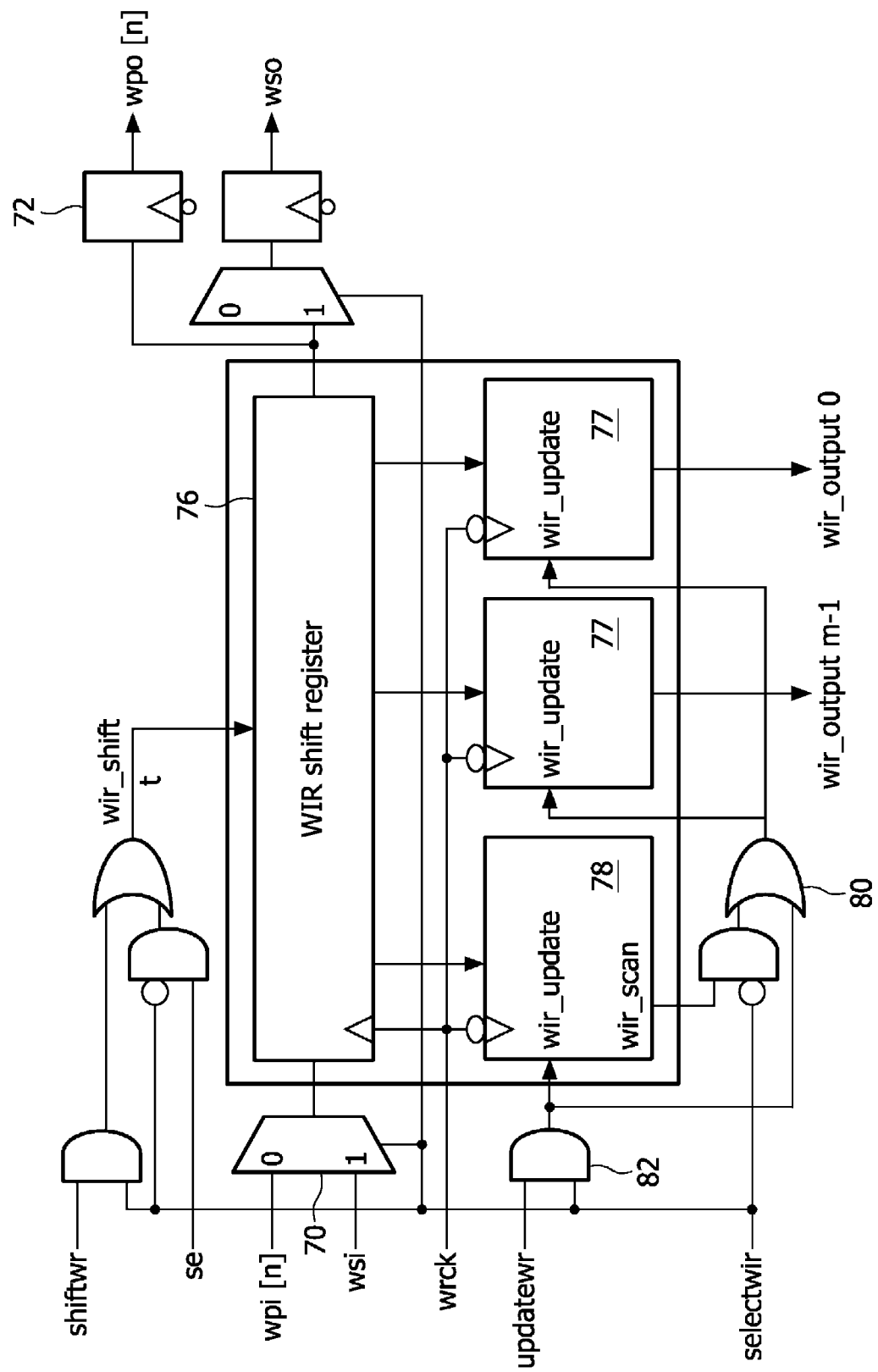

FIG. 8 corresponds to FIG. 7 but shows a second use of the additional test flexibility; and FIG. 9 shows a second example of wrapper instruction register of the invention.

The example of the invention described below provides an additional input which can feed user selected data into the instruction register. Data in the instruction register can be used to trigger an update mode, so that an instruction register output can be provided dynamically, with the update initiated by data fed into the shift register. This mode can be used when the serial input is not using the instruction register, for example in a bypass mode, or a test mode.

Before describing the invention in further detail, a more detailed outline of the wrapper structure and operation will be given.

Figure 1:
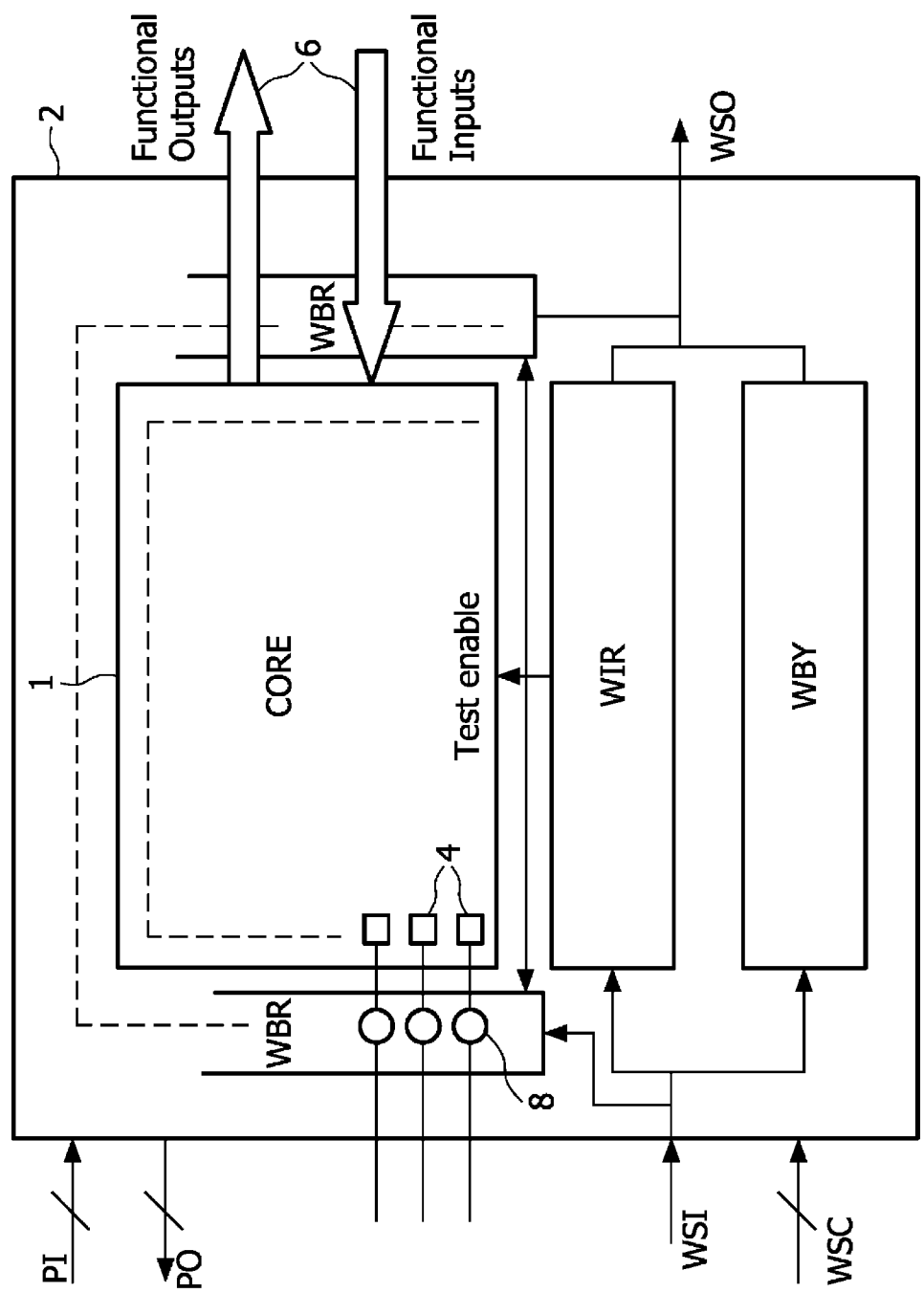
FIG. 1 shows a known testing circuit wrapper for an integrated circuit core.
Figure 2:
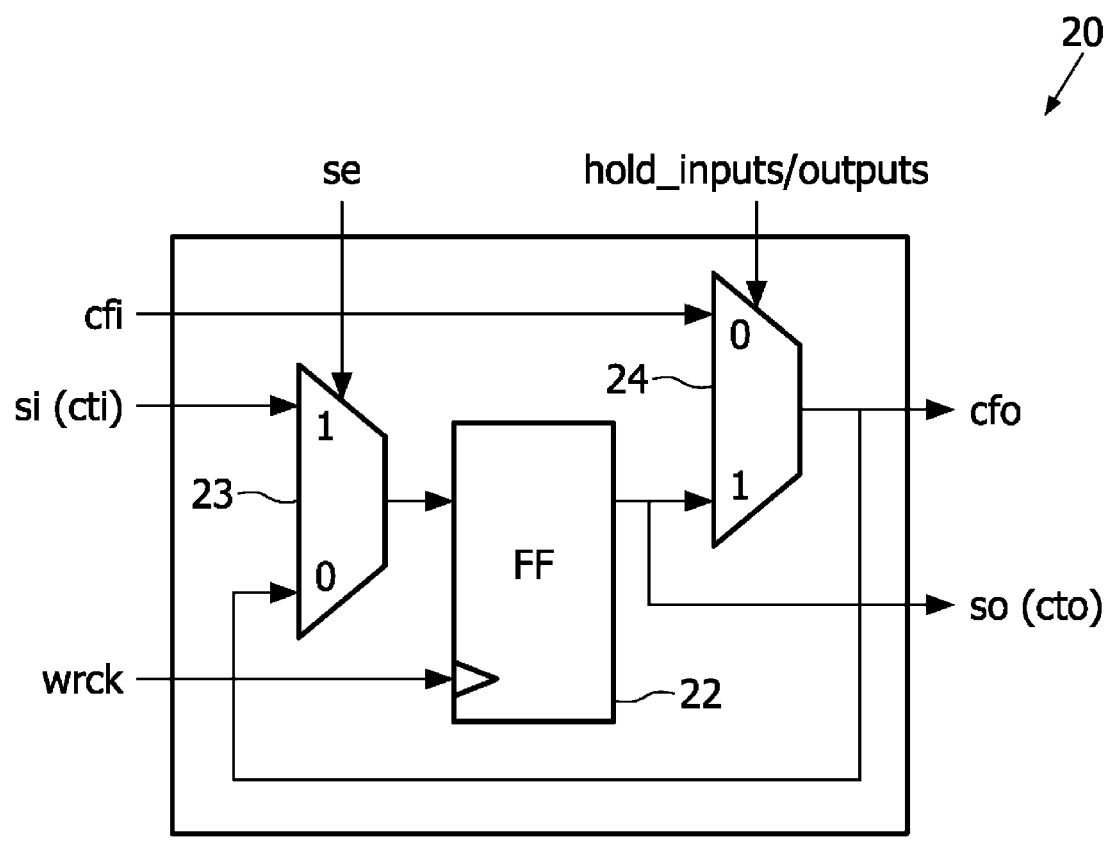
FIG. 2 shows one wrapper boundary cell of the circuit of FIG. 1 in more detail.

As mentioned above, the Wrapper Boundary Register is formed as a plurality of cells, and FIG. 2 shows an example of one such cell 20, corresponding to one of the cells 8 shown in FIG. 1.

This cell can be configured as an input cell or as an output cell. For an input cell, the hold_inputs/outputs signal is "hold_inputs" and for an output cell, the hold_inputs/outputs signal is "hold_outputs".

These hold signals control the WBR cells, and the hold signals are static, to select between core internal (inward facing) and core interconnect (outward facing) tests. The hold signals are generated in response to the interpretation of the WIR instruction, and are controlled in dependence on the selected test (or diagnostic or application) mode. The application mode essentially comprises the disabling of the wrapper to allow normal functionality of the core.

The cell 20 receives a serial input "si", which is the cell test input "cti". This serial input is clocked to the serial output "so", which is the cell test output "cto" by the flip flop 22 when a shift enable control line "se" is high. This shift enable control signal controls a multiplexer 23. The shift enable control line thus controls shifting of signals along the scan chain. Note that the shift enable control lines "se" are related to the command "shiftWR".

For an input cell, in order to provide a signal to the core, in response to a high hold signal at the control line "hold_inputs", the output of the flip flop 22 is provided to the cell functional output "cfo" through multiplexer 24. This is also fed back to the multiplexer 23, and with the shift enable line low, this signal is fed to the flip flop 22 to maintain the cell functional output stable. Thus, a cell test input signal stored in the flip flop is held on the cell test output. The input cell can also observe the environment external to the core, and route this to the serial output.

For an output cell, a signal can be received from the core at the cell function input, and with the hold_outputs signal low, this can be routed (with shift enable low) to the serial output. Similarly, a cell test input can be routed to the cell functional output.

It can be seen that an input cell can provide a test signal to the core, and an output cell can receive a response from the core, and can also provide an outward facing test signal to the circuitry outside the core. These functions are controlled by the hold signal values, which provide the control of the way the WBR operates.

Figure 3:
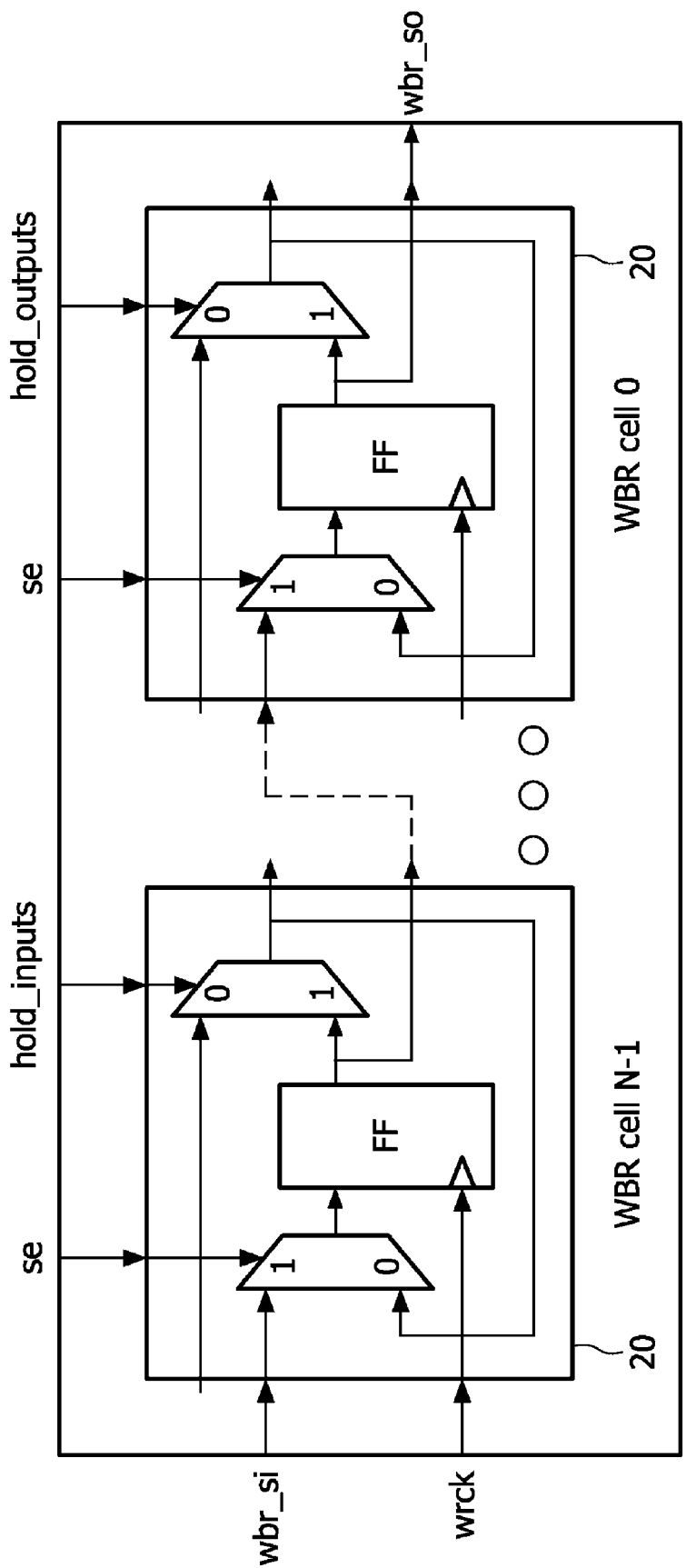
FIG. 3 shows the wrapper boundary register of the circuit of FIG. 1.

FIG. 3 shows multiple cells 20 of FIG. 2 connected in series to define the WBR, which is shown as formed from N cells (numbered 0 to N−1). Some of the cells are configured as input cells (for input terminals of the core) and others are configured as output cells (for output terminals of the core). FIG. 3 thus represents the full WBR shown in FIG. 1.

Figure 4:
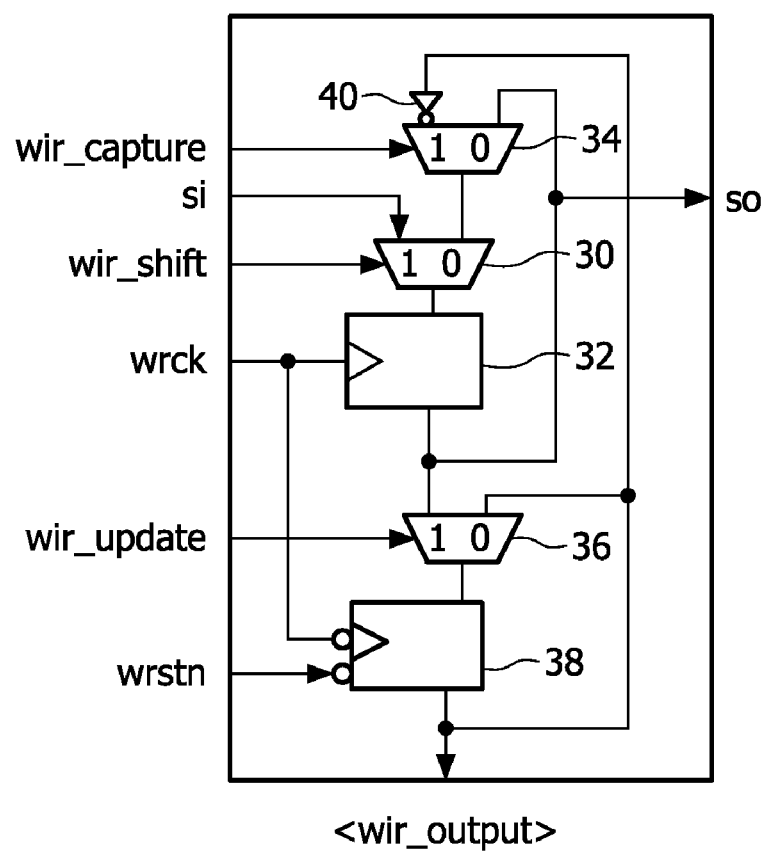
FIG. 4 shows one possible slice architecture for the wrapper instruction register of FIG. 1.

FIG. 4 shows one possible way to implement an instruction register block, forming a building block for the WIR.

FIG. 4 shows the wrapper instruction register "Capture", "Shift" and "Update" signals, as well as the clock "wrck" and reset "wrstn" signals.

The serial input "si" is supplied to the "1" input of a multiplexer 30 which is controlled by the shift signal. When the shift signal is high, this serial input is fed to a first flip flop 32, which clocks the input signal to the serial output "so". This provides a serial chain operation.

The output is also fed back to a second multiplexer 34 which implements the capture function. In the absence of a capture command, the output is fed to the "0" input of the multiplexer 30. This maintains the output stable until the next high shift signal, which replaces the input to the multiplexer 30 with the next serial input value.

The serial output is also provided to a third multiplexer 36, and this passes the output to a second flip flop 38 in response to a high update signal. After an update signal, the output of the flip flop 38 is stable, as the output is fed back to the "0" input of the multiplexer 36. Thus, after the update action, the output of the flip flop 38 is stable and stores the value in the flip flop 32. This defines the wrapper instruction register (WIR) output.

The reset signal resets the WIR output, and the application mode is also implemented (effectively disabling the wrapper) during the reset mode of operation.

It can be seen that the functionality of the circuit shown in FIG. 4 can be selected to:

shift a serial input to the serial output using the shift signal, and through the flip flop 32;

load an "external" signal into the flip flop 32, which can in turn be routed to the flip flop 38 or to the serial output.

In FIG. 4, the flip flop 32 forms part of a serial instruction register, and the flip flop 38 forms part of a parallel update register. Data can be loaded into the update register in parallel and independently of the serial operation. Thus, test mode conditions can be stored in the parallel update register, while a new set of test mode conditions (i.e. an instruction) is loaded into the serial shift register.

The circuit of FIG. 4 has additional test functionality, and for this purpose the WIR output is also fed back to the "1" input of the multiplexer 34, through an inverter 40.

This circuit uses the capture signal as an internal test control. When the capture signal goes high, the inverse of the WIR output is supplied to the multiplexer 30, and this in turn is supplied to the flip flop 32 when there is no shift signal input. This inverted WIR output thus can be controlled to propagate through the structure to the WIR output using the update control signal.

Figure 5:
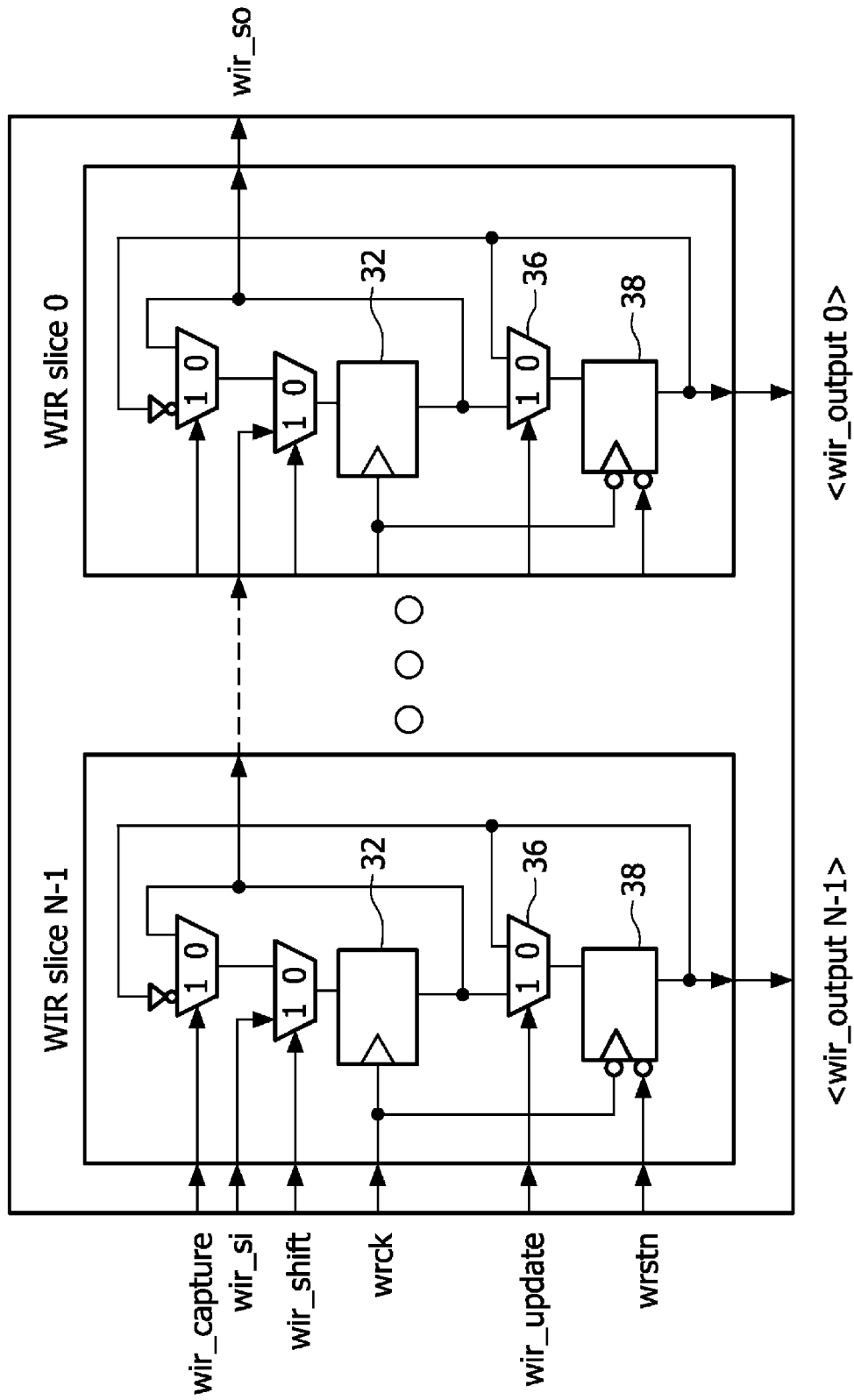
FIG. 5 shows the wrapper instruction register of the invention formed using the slices of FIG. 4.

FIG. 4 shows one building block for forming the Wrapper Instruction Register, and FIG. 5 shows the Wrapper Instruction Register formed using the building block of FIG. 5.

As shown, the WIR comprises a series chain of the elements of FIG. 4, with the serial output of one connected to the serial input of the next. All units share the same clock, capture, shift, update and reset signals.

This register provides serial loading of data using the WIR serial input ("si") port and the parallel provision of the WIR output, which can comprise a test vector to be applied to the core under test.

However, the architecture also allows testing of the instruction register, in particular to monitor the propagation of 1s and 0s through the serial flip flops and through the capture and shift multiplexers and the propagation of 1s and 0s through the update flip flops through the update multiplexers. The propagation of 1s and 0s through the series scan chain connections between slices can also be monitored using the serial output.

The invention relates to the WIR, and enables signals driven by the instruction register to be allocated dynamic values during test. These dynamic values can be loaded into the WIR shift register using a standard scan protocol, and the approach is thus supported by standard automatic test pattern generation (ATPG).

Figure 6:
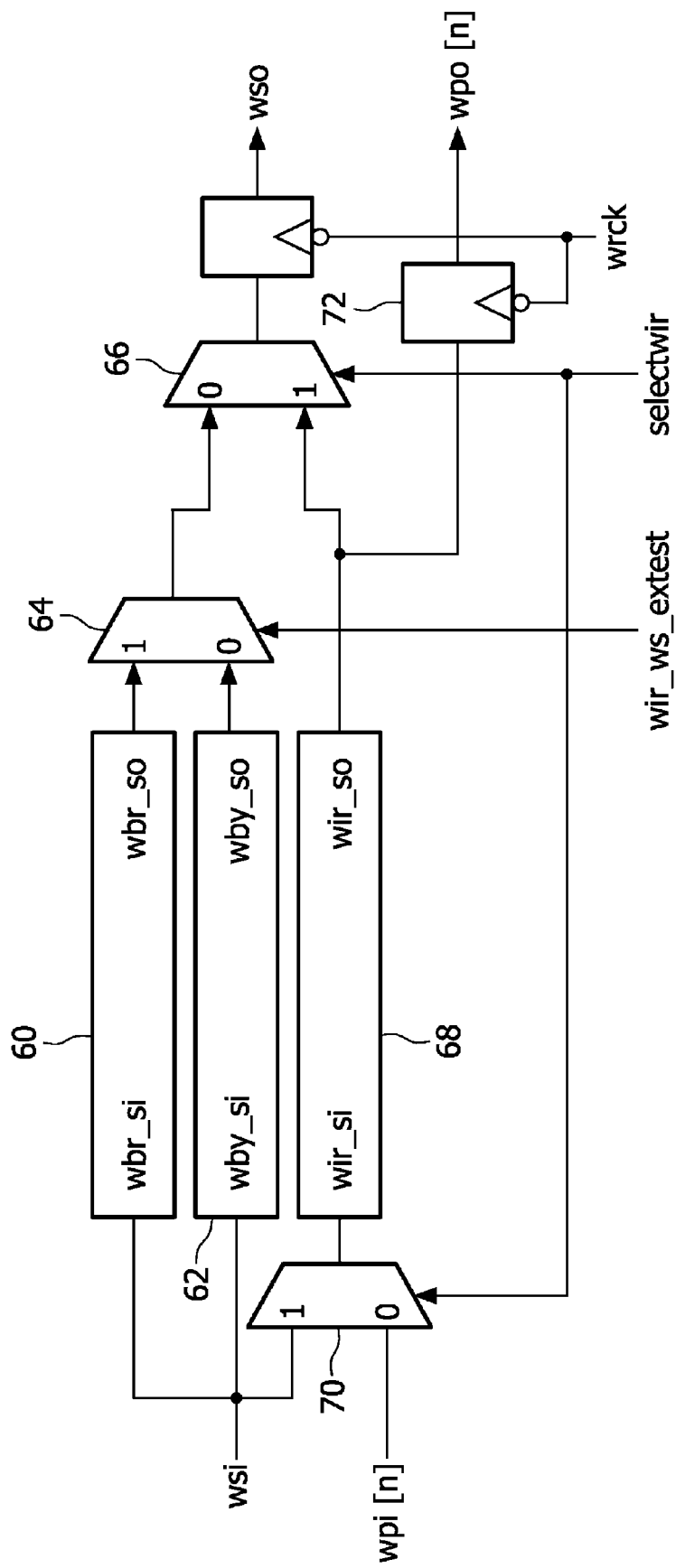
FIG. 6 shows the configuration of the invention to enable access to the wrapper instruction register using one port of a parallel wrapper interface.

FIG. 6 shows how the different registers described above can be connected together in accordance with an example of the invention.

As shown, the wrapper serial input "wsi" is provided to the Wrapper Boundary Register WBR 60 and to the Bypass Register WBY 62. A first multiplexer 64 determines whether the WBR or WBY output is passed on, in response to a test signal "wir_ws_extest" (driven by the WIR). This signal determines whether or not an external test is being carried out, in which case serial data is fed directly into the WBR. If there is no external test, the bypass register is in use.

The "selectwir" signal indicates if the test register is being used, during which serial data is loaded into the WIR If the WIR is selected by the "selectwir" signal, then the WIR output is provided as the serial wrapper output "wso", whereas if the WIR is not selected, then the output of either the WBR or the WBY is passed to the serial output. This selection is by a second multiplexer 66.

When the WIR is not being used, it can be used for internal scan chain data of the core and chip. Thus, the arrangement of FIG. 6 provides the WIR shift register 68 concatenated with standard internal scan chains of the core and of the chip. The internal scan chain data (serial data) is received at the wrapper parallel input "wpi[n]", and this may be one pin of the parallel interface. The output is provided as a wrapper parallel output "wpo[n]". To enable concatenation of the WIR shift register 68 and this core/chip internal scan chain, an additional multiplexer 70 and an anti-skew element 72 are added to the standard IEEE 1500 architecture.

The multiplexer 70 supplies the internal scan chain data to the parallel input wpi[n] and in turn to the WIR register when the WIR register is not selected, namely when the "selectwir" signal is low. Thus, the connection to the internal scan chain can (if desired) be in parallel with the provision of serial input data to the WBR or WBY registers.

The anti-skew element 72 is clocked by the main clock signal "wrck" and is used to enable communication between one clock domain and another.

FIG. 7 shows in more detail the wrapper instruction register and associated control logic of the invention, and which uses the access provided by the arrangement of FIG. 6 between a parallel input port and the WIR to provide increased testing capability.

As explained with reference to FIGS. 4 and 5, the WIR stages each comprise a serial register portion and a parallel update portion. In FIG. 7, the combination of serial portions is illustrated as 76, and the parallel update portions are shown as 77.

When the selectwir signal is low, the parallel input wpi[n] accesses the serial shift register 76, as explained above. The first bit of data in the serial shift register is provided to an additional circuit element 78, which may be of similar structure to the update portions 77. The circuit 78 passes the data to its output in response to an update signal, which is entitled "wir_emb", indicating an embedded test facility using the WIR.

The update is carried out as part of the normal mode of operation, namely with selectwir high. Thus, an instruction is loaded into the serial shift register using the serial port.

When the update signal is high (and with selectwir still high), this feeds to the circuit element 78, and the logic 80 also passes this to all of the other update portions 77, by the OR gate of the logic 80.

The first bit of the WIR data provides a control mechanism, as will be seen below.

After the update signal goes low, the output of the logic 80 is low so long as the selectwir signal remains high, so that the logic 80 has no influence on the operation of the circuit when selectwir is high.

However, if selectwir is brought low, the output of the logic 80 depends on the value of wir_emb. If wir_emb is high with selectwir low, the AND gate outputs a 1 which is passed through the OR gate to the update portions 77, to hold them in a fixed update mode. Thus, if a high bit is loaded into the circuit 78, an additional update mechanism is initiated when selectwir is brought low.

In this way, an update transfer from the serial register to the parallel register is triggered.

The output of the logic 80 provides an output that continuously updates the update stages of the instruction register. The update stages are updated on the inverted shift clock wrck as shown, so that called 'anti-skew' behaviour is created. This results in safe data transfer in case control signals feed into different clock domains. This behaviour maps to combinational buffer behaviour, and is fully supported by combinational ATPG.

In this additional update mode, the circuit 78 does not update and holds the output, because the wir_update is fixed low. Thus, the update mode is held regardless of the data subsequently fed through the WIR shift register.

As can be appreciated from the description above, the structure allows outputs from the WIR to be obtained based on loaded data from the parallel port wpi[n].

This enables dynamic control over the WBR cells, if these WIR outputs provide the WBR cell control. As shown in FIG. 7, the outputs of the WIR update portions 77 can map directly to the hold inputs of the WBR cells, which control the WBR functionality. This enables efficient test in cases where one core is embedded in a larger core.

After switching to the additional update mode, the scan chains are loaded with the desired stimuli data. The data values that propagate through the scan chains until the desired stimuli data is loaded are not used (as the test protocol is not executed concurrently with the WIR loading).

This enables in particular dynamic control during test of the mode of operation of the embedded wrappers, namely the inward or outward facing modes of operation.

This embedded test is activated with the selectwir signal low, and with the wir_emb signal high as explained above.

By enabling dynamic access under control of ATPG, a complete hierarchical core can be covered by one pattern set. In the case of static control only, multiple ATPG runs are needed to cover internal logic of all embedded cores (that can be hierarchical again) and the interconnects between cores.

This provides the ability to enhance existing test pattern generation software to provide additional test coverage, particularly to enable coverage of embedded cores.

FIG. 8 shows a modification in which the architecture is used to provide additional test vectors, which can then be provided in addition to those of an automated test pattern generation algorithm. In FIG. 8, the outputs of the portions 77 are shown as wir_output 0 to wir_output m−1. The signal controlling the logic 80 is renamed "wir_scan" as this is for implementing an additional WIR test vector scanned into the WIR serial shift register. Otherwise FIG. 8 corresponds to FIG. 7. This use of the architecture enables the ATPG coverage to be increased during testing of internal core logic.

These two approaches can be combined, and FIG. 9 shows an architecture in which multiple additional scan elements are provided for the embedded test and the additional scan test.

The bank 90 of circuits provide static outputs (even during the additional update mode). The two circuits 92 are for the core embedded test and provide a hold input circuit signal and a hold output circuit signal. The circuit 94 is for dynamic access, in particular for use in testing digital logic.

The system provides flexibility and enables a standard scan chain operation, a static test operation for testing analogue modules, and a dynamic test function, suitable for testing digital modules. In addition, the ability to test embedded cores is provided.

In the example above, the additional logic for providing the automatic update is essentially provided as an additional shift register element. Instead, additional logic may be provided in the shift register stages, to avoid the need for additional shift register stages. This also removes the one to one relationship of the shift stage to the update stage. Thus, a control circuit may effectively be distributed between the shift register stages.

The automatic update is initiated by an additional circuit in the example above. Instead, an additional control input may be used to provide the additional update mechanism. This may be triggered in response to specific data in the WIR shift register as in the example above or it may be externally generated as an additional test control input.

The invention has been described with reference to the IEEE STD 1500 wrapper architecture. However, the invention is applicable more generally to registers used in core testing architectures in which parallel and serial inputs are provided.

Various other modifications will be apparent to those skilled in the art.

The invention claimed is:

1. A testing circuit for the testing of an integrated circuit core or circuitry external to an integrated circuit core, the testing circuit comprising:
    a shift register circuit for storing testing instruction data, the shift register circuit comprising a plurality of stages, each stage comprising:
        a serial input and a serial output;
        a first shift register storage element for storing a signal received from the serial input and providing the signal to the serial output in a scan chain mode of operation; and
        a second parallel register storage element for storing a signal from the first shift register storage element and providing the signal to a parallel output in an update mode of operation,
    wherein the testing circuit further comprises a multiplexer for routing either a serial test input to the serial input of the shift register circuit or an additional input into the serial input of the shift register circuit, wherein the testing circuit further comprises a first input for controlling a first update mode of operation, and a second update mechanism for use when the additional input is routed to the serial input, and wherein the second update mechanism is provided by a control circuit which responds to a specific value of data stored in at least one stage of the shift register to generate an update signal for setting the other shift register stages into the update mode of operation.

2. The testing circuit as claimed in claim 1, wherein the additional input comprises at least one parallel input port of the testing circuit.

3. The testing circuit as claimed in claim 1, further comprising an instruction register select signal input, wherein when the instruction register select signal input is active, a serial input to the testing circuit is routed through the multiplexer to the serial input of the shift register circuit, and when the instruction register select signal input is not active, the control circuit generates the update signal if the specific value of the data stored in the at least one stage of the shift register is present.

4. The testing circuit as claimed in claim 3, further comprising an update signal input for setting the shift register stages into the update mode of operation, wherein the update signal input is operable only when the instruction register select signal input is active.

5. The testing circuit as claimed in claim 1, wherein the control circuit receives the signal loaded into one of the first shift register storage elements.

6. The testing circuit as claimed in claim 5, wherein the control circuit comprises a logic gate structure for providing an update signal to the second parallel register storage element.

7. The testing circuit as claimed in claim 6, wherein the logic gate structure is for providing an update signal when an instruction register select signal is not active and the specific value of the data stored in the at least one stage of the shift register is present, or when the instruction register select signal is active and an external update signal is active.

8. The testing circuit as claimed in claim 7, further comprising at least one additional control output port at the serial output of the shift register circuit.

9. The testing circuit as claimed in claim 8, wherein an anti-skew element is provided at the additional control output port.

10. The testing circuit as claimed in claim 1, wherein the second update mechanism is provided by a control circuit, and wherein the data stored in the second parallel register storage elements after an update initiated by the control circuit is used to control wrapper boundary register cells.

11. The testing circuit as claimed in claim 1, wherein the second update mechanism is provided by a control circuit, and wherein the data stored in the second parallel register storage elements after an update initiated by the control circuit is provided as a wrapper instruction register output.

12. The testing circuit as claimed in claim 1, wherein the second update mechanism is provided by a control circuit, and wherein control circuit responds to specific values of data stored in at least two stages of the shift register to generate a first signal for providing testing of an embedded core, and a second signal for providing additional test modes.

13. The testing circuit as claimed in claim 1, wherein the shift register circuit comprises a Wrapper Instruction Register for an embedded core test architecture.

14. The testing circuit as claimed in claim 13, wherein the shift register circuit comprises a Wrapper Instruction Register for an IEEE STD 1500 embedded core test architecture.

15. The testing circuit as claimed in claim 1, wherein:
    the first shift register storage element comprises a first flip flop;
    the second parallel register storage element comprises a second flip flop.

16. An IEEE STD 1500 wrapper comprising:
the testing circuit as claimed in claim 13 in which the shift register circuit comprises a Wrapper Instruction Register;
a Wrapper Boundary Register; and
a Wrapper Bypass Register.

17. An integrated circuit comprising the integrated circuit core and the IEEE STD 1500 wrapper as claimed in claim 16.

18. A method of testing of integrated circuit core or circuitry external to an integrated circuit core, the method comprising using a core wrapper in first and second modes, wherein:
in the first mode, a serial input is coupled to a wrapper instruction register and stored in serial shift register storage elements, and in response to an update signal, the wrapper instruction stored in the serial shift register is loaded into a parallel update register;
in the second mode, user data is provided to the serial input using one port of a wrapper parallel interface, and the wrapper instruction stored in the serial shift register is continuously loaded into the parallel update register in response to a continuous update signal,
wherein in the second mode data stored in the wrapper instruction register is used to determine whether or not to generate the continuous update signal for setting the shift register stages into the update mode of operation.

19. The method as claimed in claim 18, wherein in the second mode, the data stored in one or more stages of the serial shift register is used to control the generation of the continuous update signal.

20. The method as claimed in claim 18, wherein in the first mode, data from an automatic test pattern generation system is provided to the serial input.

21. The method as claimed in claim 18, wherein the second mode is used to provide additional test modes.

22. The method as claimed in claim 18, wherein the second mode is used for testing of embedded cores within a larger core.

\* \* \* \* \*